(12) United States Patent
Wu

(10) Patent No.: US 8,017,873 B2
(45) Date of Patent: Sep. 13, 2011

(54) BUILT-IN METHOD OF THERMAL DISSIPATION LAYER FOR DRIVER IC SUBSTRATE AND STRUCTURE THEREOF

(75) Inventor: Chia-Hui Wu, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 681 days.

(21) Appl. No.: 12/167,242

(22) Filed: Jul. 2, 2008

(65) Prior Publication Data

US 2009/0218116 A1 Sep. 3, 2009

Related U.S. Application Data

(60) Provisional application No. 61/033,021, filed on Mar. 3, 2008.

(51) Int. Cl.
*H05K 1/00* (2006.01)
*H05K 1/03* (2006.01)
*H05K 1/14* (2006.01)

(52) U.S. Cl. ........ 174/254; 174/250; 174/255; 174/260; 361/751; 361/760; 361/762; 438/106; 438/108; 438/118; 257/668; 257/676; 257/737; 257/783; 349/150; 349/151; 349/152; 29/832; 29/841; 29/846; 29/854

(58) Field of Classification Search ............ 361/719, 361/720, 721, 732, 748, 760–767, 783, 820; 174/250, 252, 254–257, 260–268, 35.51 R; 349/58, 60, 82, 87, 94, 123, 124, 149, 150–152, 349/188, 200; 157/632, 668, 686, 684, 702, 157/712, 713, 717, 732, 705, 618, 736, E23, 157/E21.514; 438/118, 119, 770; 29/827, 29/829, 830, 832, 840–842, 854; 428/1.1, 428/1.3, 1.31, 411.1, 426, 1.2, 29, 916; 156/172, 156/250, 169, 184–188, 193; 165/80.3, 104.33, 165/185

See application file for complete search history.

(56) References Cited

U.S. PATENT DOCUMENTS

| | | | | |
|---|---|---|---|---|
| 5,042,919 A | * | 8/1991 | Yabu et al. | 349/150 |
| 5,627,405 A | * | 5/1997 | Chillara | 257/668 |
| 5,822,030 A | * | 10/1998 | Uchiyama | 349/149 |
| 5,822,191 A | * | 10/1998 | Tagusa et al. | 361/751 |
| 6,245,175 B1 | * | 6/2001 | Hotta et al. | 156/172 |
| 6,335,563 B1 | * | 1/2002 | Hashimoto | 257/632 |
| 6,394,821 B1 | * | 5/2002 | Matsumura et al. | 439/91 |
| 6,542,374 B1 | * | 4/2003 | Muramatsu et al. | 361/760 |
| 6,544,818 B2 | * | 4/2003 | Yagi et al. | 438/118 |
| 6,592,783 B2 | * | 7/2003 | Kumakura et al. | 252/500 |
| 6,603,071 B2 | * | 8/2003 | Takao | 174/538 |

(Continued)

FOREIGN PATENT DOCUMENTS

JP 88361 1/1996

(Continued)

*Primary Examiner* — Michail V Datskovskiy
(74) *Attorney, Agent, or Firm* — Winston Hsu; Scott Margo

(57) ABSTRACT

A chip on film (COF) structure includes a flexible circuit board and a chip. The flexible circuit board includes a flexible base film and a conductive layer. The flexible base film has a polyimide layer and an anisotropic conductive layer (ACL). The conductive layer is disposed on the flexible base film. The conductive layer and the ACL are separated by the polyimide layer. The chip is mounted with the conductive layer via interconnectors.

6 Claims, 3 Drawing Sheets

U.S. PATENT DOCUMENTS

| | | | |
|---|---|---|---|
| 6,669,869 B2 * | 12/2003 | Yamaguchi et al. | 252/512 |
| 6,677,664 B2 * | 1/2004 | Inoue et al. | 257/668 |
| 6,680,517 B2 * | 1/2004 | Namba | 257/499 |
| 6,738,123 B1 * | 5/2004 | Takahashi et al. | 349/152 |
| 6,864,119 B2 * | 3/2005 | Seko | 438/106 |
| 6,908,790 B2 * | 6/2005 | Nakahara et al. | 438/108 |
| 6,952,250 B2 * | 10/2005 | Ueda | 349/150 |
| 7,038,313 B2 * | 5/2006 | Mochizuki et al. | 257/713 |
| 7,084,517 B2 * | 8/2006 | Uchiyama | 257/783 |
| 7,087,987 B2 * | 8/2006 | Chung et al. | 257/676 |
| 7,134,879 B2 * | 11/2006 | Sugimoto et al. | 439/66 |
| 7,515,240 B2 * | 4/2009 | Lu et al. | 349/151 |
| 7,586,577 B2 * | 9/2009 | Morishita et al. | 349/151 |
| 7,647,694 B2 * | 1/2010 | Konishi et al. | 29/832 |
| 7,683,482 B2 * | 3/2010 | Nishida et al. | 257/737 |

FOREIGN PATENT DOCUMENTS

| | | |
|---|---|---|
| KR | 1020060001159 A | 1/2006 |
| KR | 100652519 B1 | 12/2006 |
| KR | 1020070027800 A | 3/2007 |
| KR | 1020080018555 | 2/2008 |

* cited by examiner

BUILT-IN METHOD OF THERMAL DISSIPATION LAYER FOR DRIVER IC SUBSTRATE AND STRUCTURE THEREOF

CROSS REFERENCE TO RELATED APPLICATIONS

This application claims the benefit of U.S. provisional application No. 61/033,021, which was filed on Mar. 3, 2008.

BACKGROUND OF THE INVENTION

1. Field of the Invention

The present invention relates to a chip on film (COF), and more particularly, to a built-in method of thermal dissipation layer for driver IC substrate and a structure thereof.

2. Description of the Prior Art

In recent years, liquid crystal display (LCD) screens have been in widespread use in all kinds of electronic apparatus such as mobile phones, personal digital assistants (PDA) and notebooks. As the size of display screens increases, light and thin liquid crystal display devices are being substituted for traditional display devices such as cathode ray tube (CRTs), and therefore play an increasingly important role in the display field.

As the size of an LCD gets larger, the number of channels for the driver integration circuit and the operation frequency are substantially increased. However, with the increase in the number of channels for the driver IC and the operation frequency, the performance and the lifetime of the device might be reduced due to unduly overheating of the driver IC. Thus, it is therefore desired to provide methods and apparatus for improving thermal dissipation and reducing overheating of the IC of the liquid crystal display devices.

SUMMARY OF THE INVENTION

It is therefore one of the objectives of the present invention to provide a built-in method of thermal dissipation layer for a driver IC substrate and a structure thereof for improving thermal dissipation, in order to solve the above-mentioned problem.

According to an exemplary embodiment of the present invention, a COF structure is also disclosed. The COF structure comprises a flexible circuit board and a chip. The flexible circuit board has a flexible base film and a conductive layer. The flexible base film has a polyimide layer and an anisotropic conductive layer (ACL). The conductive layer is disposed on the flexible base film. The conductive layer and the ACL are separated by the polyimide layer. The chip is mounted with the conductive layer via interconnectors.

According to an exemplary embodiment of the present invention, a built-in method of thermal dissipation layer for a driver IC substrate is disclosed. The method comprises: providing a flexible circuit board having a flexible base film and a conductive layer, wherein the flexible base film comprises a polyimide layer and an anisotropic conductive layer (ACL), and the conductive layer and the ACL are separated by the polyimide layer; and mounting a chip with the conductive layer via interconnectors.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
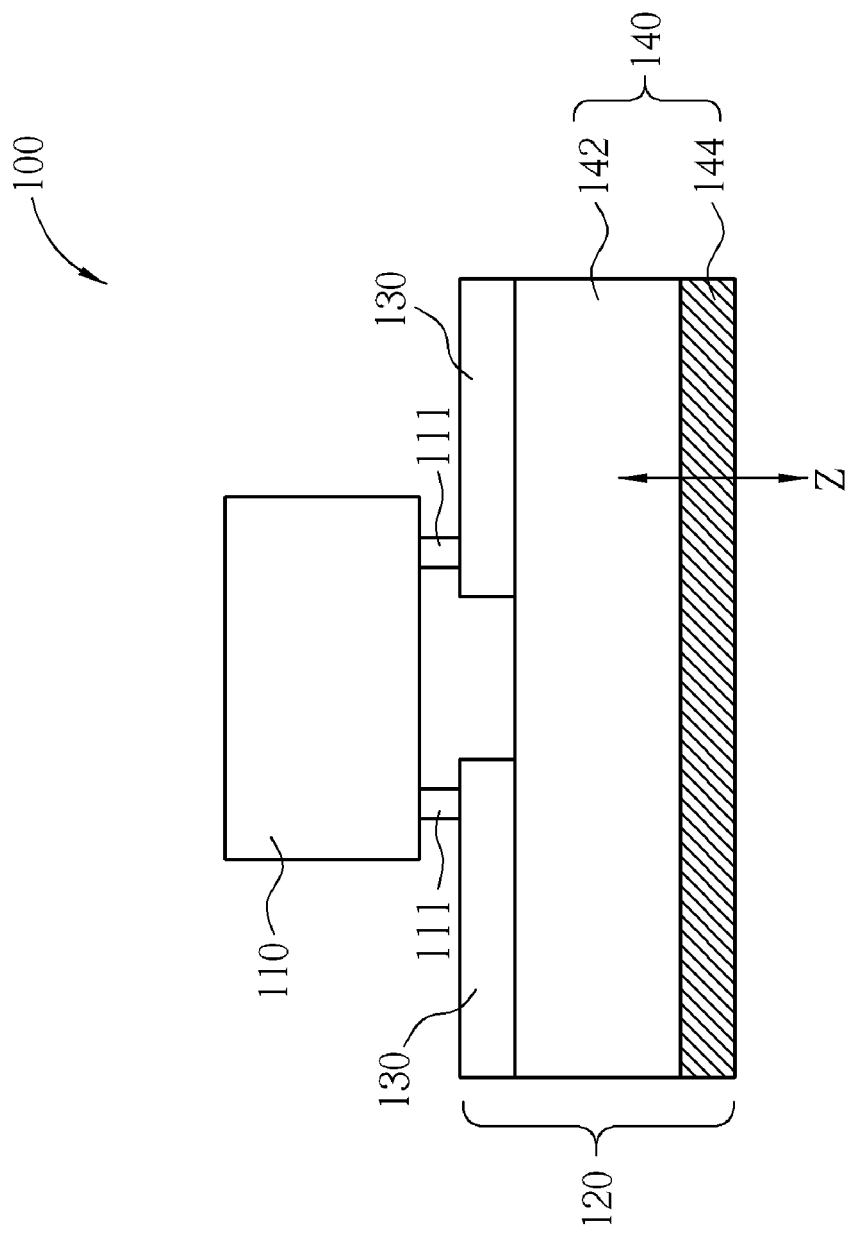
FIG. 1 is a sectional view illustrating a COF structure according to an embodiment of the present invention.

Please refer to FIG. 1. FIG. 1 is a sectional view illustrating a chip on film (COF) structure 100 according to an embodiment of the present invention. As shown in FIG. 1, the COF structure 100 comprises a chip 110 and a flexible circuit board 120 (i.e. substrate). The flexible circuit board 120 has a conductive layer 130 and a flexible base film 140. The flexible base film 140 has a polyimide layer 142 and an anisotropic conductive layer (ACL) 144. The conductive layer 130 is formed on the polyimide layer 142, and the conductive layer 130 and the ACL 144 are separated by the polyimide layer 142. The chip 110 is mounted on the flexible circuit board 120 by bonding its interconnectors 111 with the conductive layer 130. Further description of the COF structure 100 is detailed as below; this description is merely for greater clarity of understanding, however, and should not be taken as limiting the present invention.

In the COF structure 100, the ACL 144 is made of polyimide (PI) and anisotropic conductive particles, and is conductive in a particular direction substantially perpendicular to a surface between the polyimide layer 142 and the ACL 144. For example, the ACL 144 is conductive in the direction Z shown in FIG. 1.

Figure 2:
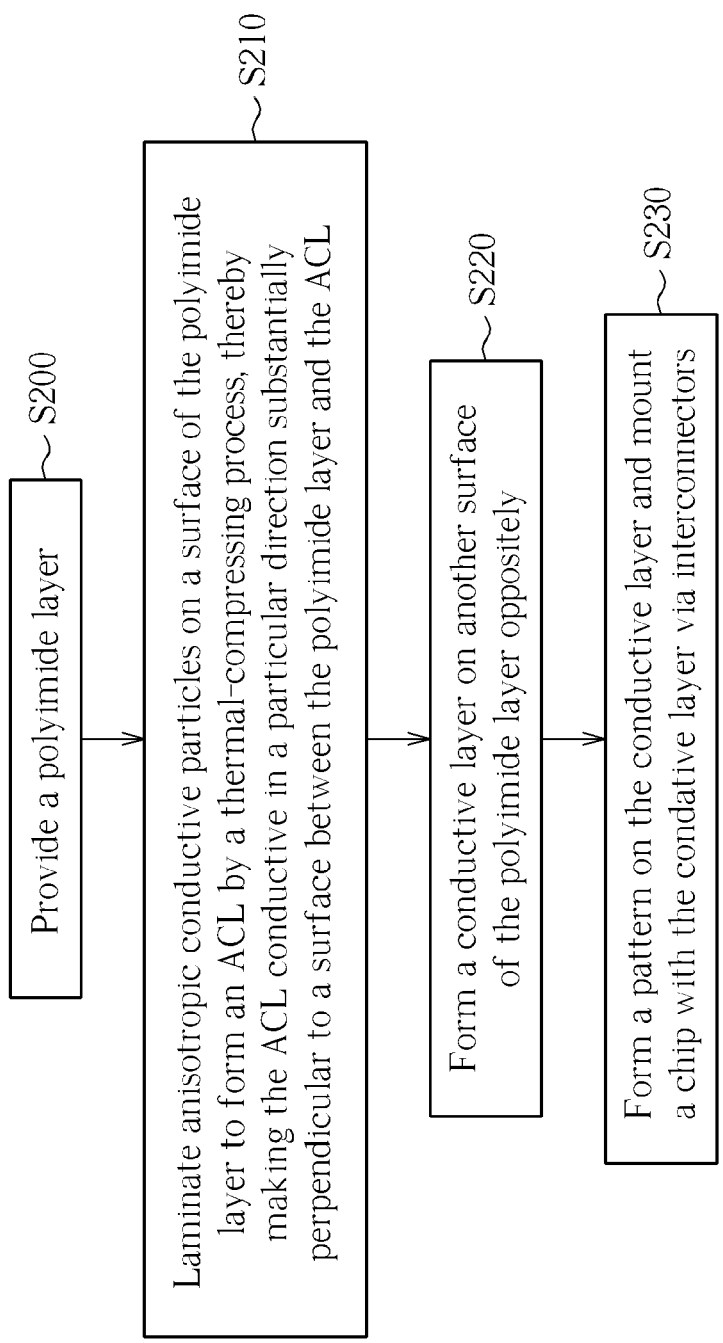
FIG. 2 is a flowchart illustrating a built-in method of thermal dissipation layer for a driver IC substrate method according to a first embodiment of the present invention.

Please refer to FIG. 2. FIG. 2 is a flowchart illustrating a built-in method of thermal dissipation layer for a driver IC according to a first embodiment of the present invention. This method can be integrated into the so-called "Cu plating" type of COF. The steps are briefly described as follows:

Step S200: Provide a polyimide layer.

Step S210: Laminate anisotropic conductive particles on a surface of the polyimide layer to form an ACL by a thermal-compressing process, thereby making the ACL conductive in a particular direction substantially perpendicular to a surface between the polyimide layer and the ACL.

Step S220: Form a conductive layer on another surface of the polyimide layer oppositely.

Step S230: Form a pattern on the conductive layer and mount a chip with the conductive layer via interconnectors.

Figure 3:
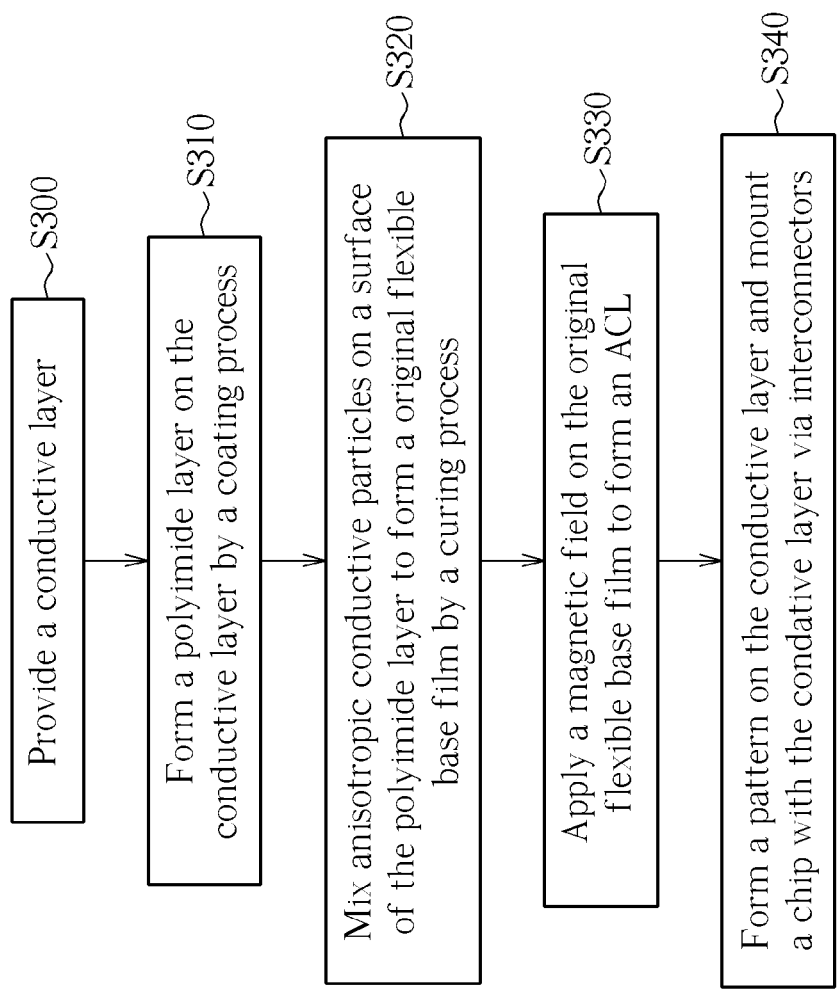
FIG. 3 is a flowchart illustrating a built-in method of thermal dissipation layer for a driver IC substrate according to a second embodiment of the present invention.

Please refer to FIG. 3. FIG. 3 is a flowchart illustrating a built-in method of thermal dissipation layer for a driver IC according to a second embodiment of the present invention. This method can be integrated into the so-called "PI casting" type of COF. The steps are briefly described as follows:

Step S300: Provide a conductive layer.

Step S310: Form a polyimide layer on the conductive layer by a coating process.

Step S320: Mix anisotropic conductive particles on a surface of the polyimide layer to form an original flexible base film by a curing process.

Step S330: Apply a magnetic field on the original flexible base film to form an ACL.

Step S340: Form a pattern on the conductive layer and mount a chip with the conductive layer via interconnectors.

The built-in method of thermal dissipation layer for a driver IC substrate of the present invention should be readily appreciated by those skilled in the art after referring to the flowcharts in FIG. 2 and FIG. 3, so further description is omitted here for the sake of brevity. In addition, it should be noted that as long as the result is substantially the same, the steps in FIG. 2 and FIG. 3 are not limited to be executed according to the exact order shown in the exemplary flow chart.

In the COF structure 100 of the present invention, the flexible base film 140 has not only the polyimide layer 142, but also the ACL 144. The ACL 144 has a good capability to conduct heat so it can help dissipate the heat generated from the chip 110 to improve thermal dissipation. In addition, the method for manufacturing a COF structure of the present invention is an effective production method, because it requires only replacing the original raw material of the flexible base film for COF makers. Furthermore, the thickness of the ACL (thermal dissipation layer) can be controlled to meet the limitation of different mechanical reliability tests and respective thermal dissipation requirement.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip on film (COF) structure, comprising:
    a flexible circuit board, having:
        a flexible base film, having a polyimide layer and an anisotropic conductive layer (ACL); and
        a conductive layer, disposed on the flexible base film, wherein the conductive layer and the ACL are separated by the polyimide layer; and
    a chip, mounted with the conductive layer via interconnectors.

2. The COF structure of claim 1, wherein the ACL is conductive in a direction substantially perpendicular to a surface between the polyimide layer and the ACL.

3. The COF structure of claim 1, wherein the ACL is composed of polyimide (PI) and anisotropic conductive particles.

4. A method of making a chip on film (COF) structure, comprising:
    providing a flexible circuit board having a flexible base film and a conductive layer, wherein the flexible base film comprises a polyimide layer and an anisotropic conductive layer (ACL), and the conductive layer and the ACL are separated by the polyimide layer; and
    mounting a chip with the conductive layer via interconnectors.

5. The method of making the COF structure of claim 4, wherein the step of providing the flexible circuit board comprises:
    providing the polyimide layer;
    laminating anisotropic conductive particles on a surface of the polyimide layer to form the ACL by a thermal-compressing process, thereby making the ACL conductive in a particular direction substantially perpendicular to a surface between the polyimide layer and the ACL; and
    forming the conductive layer on another surface of the polyimide layer.

6. The method of making the COF structure of claim 4, wherein the step of providing the flexible circuit board comprises:
    providing the conductive layer;
    forming the polyimide layer on the conductive layer;
    mixing anisotropic conductive particles on a surface of the polyimide layer to form a original flexible base film; and
    applying a magnetic field on the original flexible base film to form the ACL.

* * * * *